United States Patent
Zhang

[11] Patent Number: 6,038,435
[45] Date of Patent: Mar. 14, 2000

[54] VARIABLE STEP-SIZE AGC

[75] Inventor: Jin-Yun Zhang, Ottawa, Canada

[73] Assignee: Nortel Networks Corporation, Montreal, Canada

[21] Appl. No.: 08/997,728

[22] Filed: Dec. 24, 1997

[51] Int. Cl.[7] .................................................. H04B 1/06
[52] U.S. Cl. ...................... 455/234.1; 455/136; 455/138; 455/234.2; 455/232.1; 375/345
[58] Field of Search ..................................... 375/200, 345; 455/69, 234.1, 234.2, 136, 138, 232.1; 370/332, 252

[56] References Cited

U.S. PATENT DOCUMENTS

| | | | |
|---|---|---|---|
| 5,029,162 | 7/1991 | Epps | 370/252 |
| 5,128,958 | 7/1992 | Kingston et al. | 375/200 |
| 5,134,631 | 7/1992 | Kingston et al. | 375/200 |
| 5,276,685 | 1/1994 | Kepler et al. | 370/332 |
| 5,301,364 | 4/1994 | Arens et al. | 455/69 |
| 5,465,406 | 11/1995 | Whitecar et al. | 455/234.1 |
| 5,469,115 | 11/1995 | Peterzell et al. | 330/129 |
| 5,566,201 | 10/1996 | Ostman | 375/200 |
| 5,662,688 | 9/1997 | Haefner et al. | 607/5 |
| 5,745,531 | 4/1998 | Sawahashi et al. | 375/345 |

*Primary Examiner*—Lee Nguyen
*Assistant Examiner*—Isaak R. Jama

[57] ABSTRACT

An AGC method and apparatus is provided for a receiver to control the signal power of a received RF signal over a wide dynamic range and significantly reduce the ADC clipping time to a level appropriate for cellular communications. The AGC apparatus comprises an ADC (analog-to-digital converter) for generating digital samples of a received signal, a controller for providing a receiver gain setting based on the digital samples generated and an actuator for applying the receiver gain setting. The controller compares digital samples generated by the ADC to a first predetermined reference level, accumulates an error signal, calculates an attenuation adjustment based on the accumulated error signal and sums the attenuation adjustment with a previously calculated receiver gain setting for providing the actuator with an updated receiver gain setting which is applied therein. The digital samples are also compared to a second predetermined reference level for alternatively providing the updated receiver gain setting by decreasing the previously calculated receiver gain setting by a fixed amount.

15 Claims, 5 Drawing Sheets

VARIABLE STEP-SIZE AGC

FIELD OF THE INVENTION

This invention relates generally to AGC (automatic gain control) circuits, and in particular to a novel method and apparatus for providing automatic gain control for a basestation wideband receiver.

BACKGROUND ART

In wideband receivers such as those used for wireless communications, the entire RF (radio frequency) band allocated for cellular operations is digitized with a high fidelity ADC (analog-to-digital converter). In a basestation wideband receiver capable of simultaneously processing CDMA (code division multiple access), TDMA (time division multiple access) and GSM (groupe special mobile) signals, digital channels with a respective 1.23 MHz, 30 KHz and 200 KHz bandwidth are extracted from the digitized signal produced by the ADC.

However, the RF signal received by the wideband receiver may experience rapid and wide variations in signal power due to interferences from unrelated signals such as signals emitted by mobiles associated with competing service providers. Typically, the dynamic range of the wideband receiver is limited and therefore not suited to accommodate large fluctuations of the signal input power. In particular, if the overall gain and noise figure of the receiver chain are designed such that the lowest signal level received at the antenna can be processed to meet the RF sensitivity requirements, the highest signal level may overload the ADC and cause clipping of the digitized signal produced therein. This would severely impact the wideband receiver performance for other cellular users in the cell, particularly those with a low signal level since clipping of the digitized signal would result in corruption of the data extracted therefrom.

A wideband receiver will generally include an AGC (automatic gain control) circuit for counteracting overloading of the ADC due to high received signal strengths and attenuate the ADC input power within the ADC dynamic range. The AGC circuits currently available present various attenuation responses which are characterised by an attack time defined as the time required for eliminating clipping of the ADC output signal. Unfortunately however, these AGC circuits exhibit a relatively slow attack time and are therefore not designed to effectively minimize the ADC clip time. For optimal cellular communications, it would be desirable to reduce the ADC clip time so as to improve the overall performance of the wideband receiver.

Additionally, strong ADC input signals can be attenuated to fall within the ADC dynamic range with a large AGC range. In particular, it would also be desirable to have an AGC designed with a large range for accommodating large fluctuations in the power of the ADC input signal.

Accordingly, there is a need for a AGC circuit which has a large range for accommodating large fluctuations of the ADC input signal power and a fast attack time for improving the performance of the wideband receiver and more particularly for reducing the ADC clipping time to a level appropriate for cellular communications.

SUMMARY OF THE INVENTION

It is an object of the invention to obviate or mitigate one or more of the above identified disadvantages and shortcomings of current AGC designs.

This invention provides an AGC method and apparatus for controlling the signal power of a received RF signal over a wide dynamic range and significantly reduce the ADC clipping time to a level appropriate for cellular communications.

In a preferred embodiment of the invention, the AGC apparatus is incorporated in a receiver and comprises an ADC (analog-to-digital converter) for generating digital samples of a received signal, a controller which compares the digital samples to a first predetermined reference level, accumulates an error signal and calculates an attenuation adjustment based on the accumulated error signal for providing an updated receiver gain setting and an actuator for applying the updated receiver gain setting.

The invention also provides a method of providing an AGC in a receiver comprising the steps of digitizing a received signal in the receiver for producing digital samples, comparing the digital samples to a first predetermined reference level for producing an error signal, accumulating the error signal for a predetermined number of the digital samples, calculating an attenuation adjustment based the accumulated error signal and if the accumulated error signal is greater than zero, summing the attenuation adjustment with a previously calculated receiver gain setting to provide an updated receiver gain setting and applying the updated receiver gain setting in the receiver.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1:
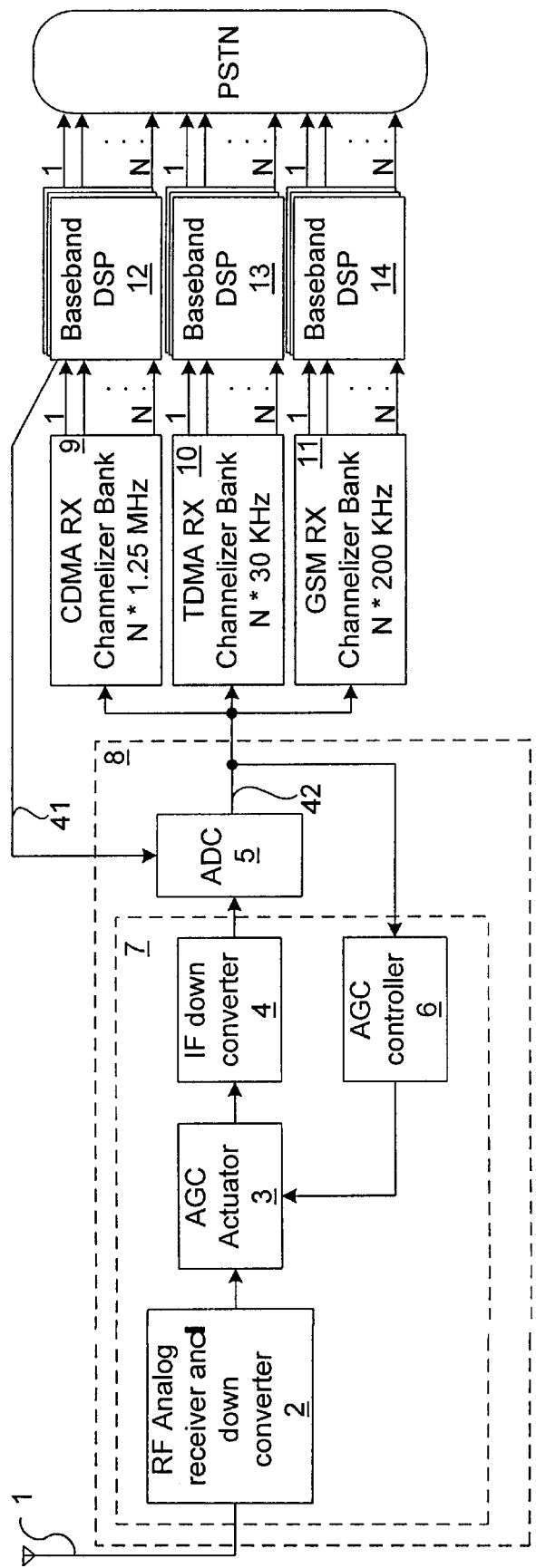
FIG. 1 is a block diagram of a basestation wideband receiver incorporating an AGC (automatic gain control) circuit according to a preferred embodiment of the invention.

Referring firstly to FIG. 1, a basestation wideband receiver which uses an AGC circuit designed in accordance with the present invention to simultaneously service multiple air interface standards such as CDMA, TDMA and GSM has an antenna 1 coupled to an RF (radio frequency) front end section generally indicated by 8. The RF front end section 8 has a wideband receiver generally indicated by 7 connected to an ADC (analog-to-digital converter) 5. The wideband receiver 7 is comprised of an RF analog receiver and downconverter unit 2, an AGC actuator 3, an IF (intermediate frequency) downconverter 4 and an AGC controller unit 6. More specifically, the RF analog receiver and downconverter unit 2 is coupled to receive an RF signal from the antenna 1 and supplies its output signal to the AGC actuator 3. The AGC actuator 3 is coupled to the IF downconverter 4 which is, in turn, connected to the ADC 5. The ADC 5 is coupled to a set of baseband DSP units 12 to derive a high frequency sampling clock signal 41 for producing a digitized signal 42 which is coupled back to the AGC actuator 3 through the AGC controller unit 6 to form an AGC loop and is also coupled to a CDMA RX (receive) channelizer bank 9, a TDMA RX channelizer bank 10 and a GSM RX channelizer bank 11. Each RX channelizer bank 9, 10, 11 produces a plurality N of channelized digital signals and is coupled to a corresponding set of baseband DSP (digital signal processor) units 12, 13, 14.

In function, the wideband receiver 7 operates to downconvert a selected band of the RF energy collected by the antenna 1. The wideband receiver also functions to adjust the gain of the RF signal received for proper signal processing (the manner in which this gain control is carried out is further explained below in reference to FIGS. 2, 3, 4 and 5). The wideband receiver 7 forwards the downconverted signals to the CDMA, TDMA and GSM RX channelizer banks 9, 10, 11 through the ADC 5 which has a sampling clock signal 41 of a sufficiently high frequency to accommodate the total bandwidth associated with the air interface standards serviced. RX channelizer banks 9, 10, 11 are all configured to separate the received digitized signal into a plurality N of channelized digital signals, each respectively with, for example, a channel bandwidth of 1.25 MHz for CDMA, 30 KHz for TDMA and 200 KHz for GSM. The channelized data respectively generated by each RX channelizer bank 9, 10, 11 is then routed to the corresponding baseband DSP units 12, 13, 14 for processing and demodulation in a form suited for distribution to the remainder of the telephony network which may, for example, include a PSTN (public switching telephone network).

For further information relating to the operation of the wideband receiver described above, reference may be made to copending U.S. patent application Ser. No. 08/996,133 entitled "Common Digitizing Rate for Multiple Air Interfaces for Generic Cell Sites in Cellular Radio" and filed Dec. 22, 1997 in the names of B. J. Lehman, J. B. Morris, G. Monette and B. Geddes. The disclosure of this application is incorporated herein by reference.

As noted above, the ADC digitized output signal 42 is fed back to the AGC actuator 3 through the AGC controller unit 6 to form the AGC loop to counteract the large fluctuations in RF signal power received by the wideband receiver 7. The AGC loop allows control of the signal power over a wide dynamic range to reduce the ADC clipping time to a level appropriate for cellular communications. The operation of the AGC loop and more particularly the architecture and operation of the AGC controller unit 6 will now be further detailed in reference to FIGS. 2, 3, 4, and 5.

Figure 2:
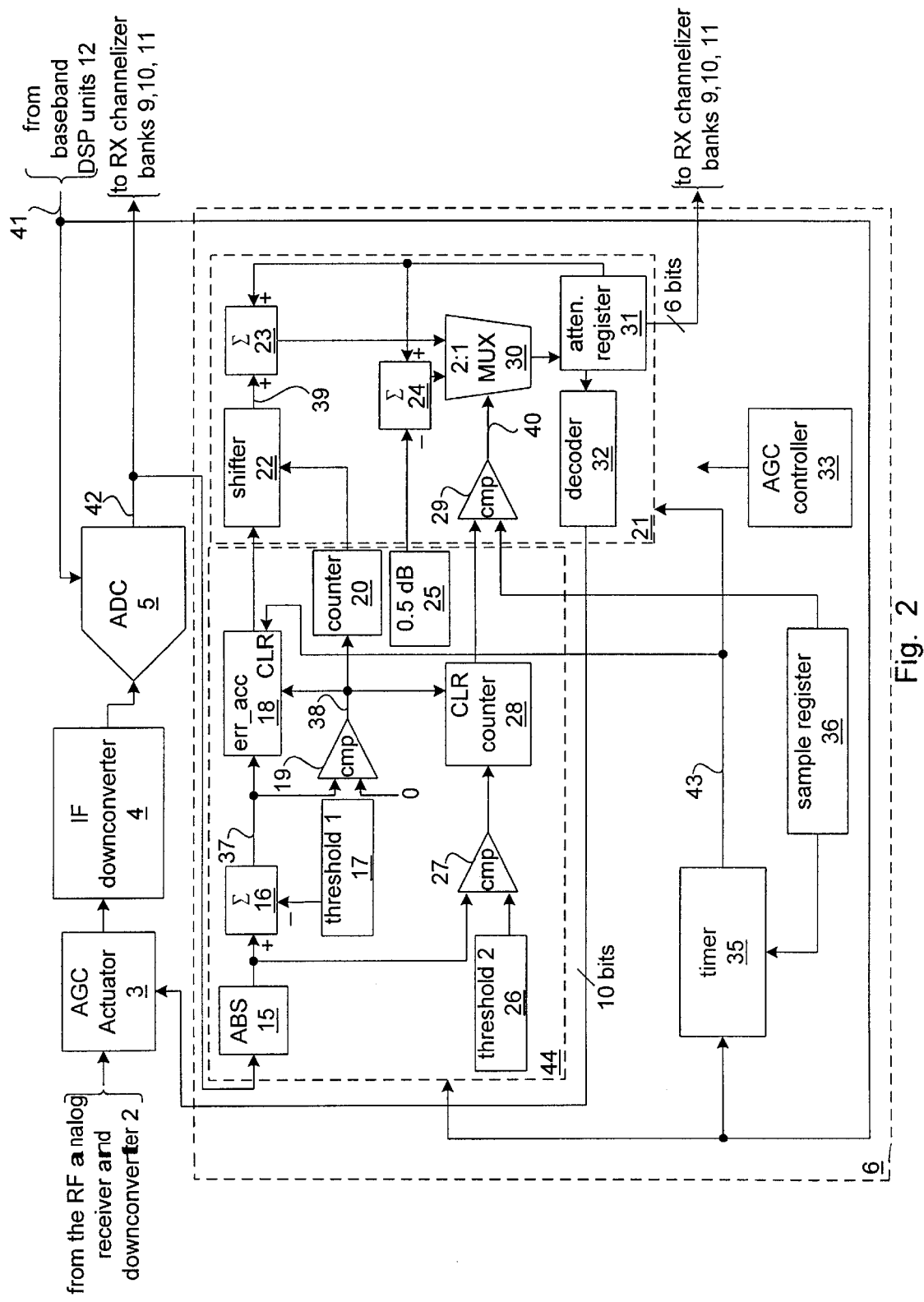
FIG. 2 is a block diagram of the AGC circuit of FIG. 1.

Referring firstly to FIG. 2, the AGC controller unit 6 of the present invention functions to ensure that the ADC 5 is, to the extent possible, operating within its dynamic range. When enabled by appropriately setting an AGC control register 33, the AGC controller unit 6 continuously monitors the digital samples generated by the ADC 5 and operates in one of an acquisition mode or recovery mode to produce a control signal to the AGC actuator 3 for appropriately adjusting the power of the ADC input signal and therefore prevent clipping of the ADC digitized signal 42 for high received mobile signal strengths.

More specifically, the AGC controller unit 6 has an absolute value converter unit (hereinafter referred to as the ABS unit) 15 connected to receive the ADC digitized signal 42. The output of the ABS unit 15 is coupled to the positive input of a subtracter 16. This subtracter 16 has its negative input coupled to a first threshold register 17 which contains a first threshold (hereinafter referred to as the attack threshold) and produces an error signal 37 which is coupled to an error accumulator 18 and also to the positive input of a comparator 19. The negative input of this comparator 19 is grounded for producing a digital output signal 38 representative of the positive or negative state of the error signal 37. The digital output signal 38 is supplied to the error accumulator 18 and to a first counter 20 both of which are coupled to a shifter 22. The shifter 22 is coupled to an adder 23 and produces an output signal 39 representative of the attenuation adjustment to be inserted into the analog signal path by the AGC actuator 3. The adder 23 supplies its output to a 2:1 multiplexer 30 which is also coupled to receive the output of a register 25 through an adder 24. The 2:1 multiplexer 30 receives an input selector signal 40 obtained from a second threshold register 26 which holds a second threshold (hereinafter referred to as the recovery threshold), a comparator 27, a second counter 28, a sample register 36 and another comparator 29 interconnected as follows.

The comparator 27 is coupled to receive the respective outputs of the threshold register 26 and the ABS unit 15 for producing an output signal to the second counter 28. The CLEAR input of this second counter 28 is connected to receive the digital output signal 38 of the comparator 19. The second counter 28 produces an output signal to the comparator 29 which is also coupled to receive the output of a sample register 36 for generating the input selector signal 40 to the 2:1 multiplexer 30. The output of the 2:1 multiplexer 30 is supplied to an attenuation register 31 which is coupled to adders 23, 24, is also coupled to the AGC actuator 3 through a decoder 32 and is also coupled to the RX channelizer banks 9, 10, 11.

The attenuation register 31, the decoder 32, the 2:1 multiplexer 30, the comparator 40, the shifter 22 and the adders 23, 24 enclosed in an area defined by 21 and the CLEAR input of the error accumulator 18 receive a clock signal 43 derived from the ADC sampling clock signal 41 through a timer 35. More specifically, the clock signal is obtained via the timer 35 which is itself coupled to the baseband DSP units 12 to receive the ADC sampling clock signal 41 and is also coupled to receive the content of the sample register 36. The remaining components of the AGC controller unit 6 located outside of area 21 and within area 44 (excluding the CLEAR input of the error accumulator 18) are directly coupled to the baseband DSP units 12 to receive the ADC sampling clock signal 41 operating at the ADC sampling rate.

In operation, the AGC controller unit 6 functions to continuously monitor the digital samples the ADC 5 generates as they are supplied to the CDMA, TDMA and GSM RX channelizer banks 9, 10, 11 to ensure that the ADC 5 is, to the extent possible, operating within its dynamic range. The ADC 5 used in the RF front end section 8 of FIG. 1 (which may be, for example, the 12 bit AD9042 manufactured by Analog Devices) has a maximum input signal level specified at 4 dBm and operates at the sampling rate of 39.3216 MHz. In particular, the AGC range is selected such that the highest signal level received at the antenna 1 can be attenuated enough by the AGC loop to fall within the ADC maximum input power. For the basestation wideband receiver described above in reference to FIG. 1 which has an overall gain of 45 dB for the RF chain and where the maximum signal strength at the antenna 1 is determined to be −21 dB, an AGC range of 31.5 dB is selected as this is large enough for the ADC 5 to comfortably function within its dynamic range.

In the acquisition mode of operation, the ACG controller unit 6 functions to counteract overload of the ADC 5 due to high received mobile signal strengths by determining when the ADC input is overloaded and correspondingly controlling the AGC actuator 3 so as to reduce clipping of the ADC digitized signal 42.

The attenuation adjustment to be inserted by the AGC actuator 3 in the analog signal path is proportional to the error between the absolute amplitude of each digital sample determined to be greater than the ADC attack threshold and the attack threshold itself. To help in reducing the ADC clip time, the attack threshold is set slightly below the upper limit of the ADC dynamic range such that the attenuation process is initiated before the ADC 5 is actually overloaded. As an example, for the ADC 5 which has a maximum input power rating of 4 dBm, the attack threshold is set −6 dBr from 4 dBm.

The average error is calculated for a specified number of digital samples defining a sample window. The average error is used to determine the gain attenuation to be inserted by the AGC actuator 3 for the duration of the next window of digital samples generated by the ADC 5. The size of the sample window is stored in the sample register 36 and is chosen to be as small as possible for achieving a fast attack time while avoiding AGC over-reaction and minimizing computation complexity. In other words, in order to achieve a fast attack time, the AGC detection and update must be as frequent as possible. However, the selection of a small sample window is limited by the AGC loop delay. In particular, if there is a larger delay between the AGC setting and the resulting ADC input signal corresponding to that setting, a fast detection and update will inevitably lead to over-reaction and undesired large variations of the AGC gain setting. To minimize the AGC loop delay and therefore allow the sample window to be smaller for providing a faster attack time, the AGC actuator 3 is preferably located in close proximity of the ADC 5. By locating the AGC actuator 3 directly before the IF downconverter 4, the sample window can be selected to be smaller so as to meet the attack time requirements for cellular communications. For example, to achieve an attack time of less than 10 uS for ADC input overloading greater than 20 dB, the preferred embodiment of the AGC controller unit 6 incorporated in a basestation receiver which uses the 12-bit AD9042 with the 39.3216 MHz sampling clock has a sample window selected to be 12 which corresponds to an attenuation update time of 300 nS.

For each sample window which has at least one sample determined to be greater than the attack threshold, a new attenuation adjustment is calculated and added to the previous attenuation setting for producing a new attenuation setting which is effected in the AGC actuator 3 for the duration of the next window of digital samples. The manner in which this average error is obtained is described as follows. For each sample received in the ABS unit 15, the error between the absolute amplitude of the sample determined in the ABS unit 15 and the attack threshold stored in the first threshold register 17 is calculated in the subtracter 16 by digitally subtracting the attack threshold value from the absolute amplitude of the sample. Next, the error signal 37 thus produced is initially supplied to the comparator 19 to determine if the error is greater than zero. If so, the first counter 20 is subsequently incremented by one and the error carried by the error signal 37 is received by the error accumulator 18 where it is accumulated. At the end of each update window, an attenuation adjustment is computed in the shifter 22 based on the accumulated error shifted by an amount corresponding to the number of digital samples recorded by the first counter 20 to have an absolute value greater than the attack threshold. The accumulated error contained in the error accumulator 18 is subsequently cleared and the attenuation adjustment is added in the adder 23 to the previous attenuation setting to become the new attenuation setting. This new attenuation setting is then selectively routed through the 2:1 multiplexer 30 and stored in the attenuation register 31 where it is subsequently supplied to and transformed by the decoder 32 into a 10-bit attenuation setting for use by the AGC actuator 3.

This process is repeated until the resulting attenuation applied by the AGC actuator 3 is such that the power of the ADC input signal is within the ADC's operational range. Further, the attenuation applied is adjusted in the manner described above until the AGC controller unit 6 receives a sample window with all of its digital samples below the attack threshold. As this occurs, the accumulated error is equal to zero and the corresponding attenuation adjustment generated by the shifter 22 is also equal to zero. This allows the attenuation setting stored in the attenuation register 31 to remain unaltered for the next sample window.

For a situation where the absolute amplitude of all the digital samples of a sample window falls below the recovery threshold which is set to be lower than the attack threshold, the AGC controller unit 6 enters into the recovery mode and functions to reduce the current attenuation setting a fixed amount which is defined as the recovery step and stored in the register 25. The recovery step is preferably set to 0.5 dB for providing slow recovery of the signal power received at the antenna 1 and therefore minimize the AGC gain setting fluctuations.

More specifically, the absolute amplitude of each sample generated by the ADC 5 is compared to the recovery threshold in the comparator 27. The recovery threshold is stored in the second threshold register 26 and is preferably set −12 dbr below the 4 dBm maximum input power rating of the ADC 5. If the absolute amplitude of the sample is below the −12 dbm recovery threshold, the second counter 28 is incremented by one. At the end of each sample window, the content of the second counter 28 is compared with the sample window size stored in the sample register 36 to determine whether all of the digital samples of the last sample window were below the recovery threshold. This occurs when the number of digital samples recorded by the second counter 28 corresponds to 12. This causes the AGC controller unit 6 to switch to the recovery mode and operate to gradually reduce the attenuation setting in 0.5 dB recovery steps. In particular, the input selector signal 40 generated by the comparator 29 is such that the previous attenuation setting stored in the attenuation register 31 is replaced by a new attenuation setting selectively obtained from the adder 24 and through the 2:1 multiplexer 30. This new attenuation setting is equal to the previous setting reduced by the 0.5 dB recovery step.

If the absolute amplitude of any one of the digital samples of a sample window is above the attack threshold, the AGC controller unit 6 immediately returns to the attack mode of operation where the attenuation adjustment is determined by the accumulated error stored in the error accumulator 18 and the content of the first counter 20. In particular, upon reception of a digital sample with an absolute amplitude higher than the attack threshold, the error signal 37 becomes greater than zero. The positive state of the error signal 37 is detected by the comparator 19 which accordingly generates its digital output signal 38 so as to simultaneously increment the first counter 28 by one and reset the second counter 28 to zero. This ensures that at the end of the sample window, the attenuation setting stored in the attenuation register 31 is replaced with the new attenuation setting obtained from the adder 23 and not from the adder 24. As a result, the AGC controller unit 6 operates in the attack mode of operation to generate the new attenuation setting based on the accumulated error stored in the error accumulator 18 and the content of the first counter 20.

The attenuation applied in the AGC actuator 3 is also signalled to the RX channelizer banks 9, 10, 11 or the baseband DSP units 12, 13, 14 and may consequently be unapplied therein by a corresponding digital compensation such that the channelized digital signals processed and demodulated by the baseband DSP units 12, 13, 14 are within a constant amplitude range independent of the AGC controller settings.

Figure 3:
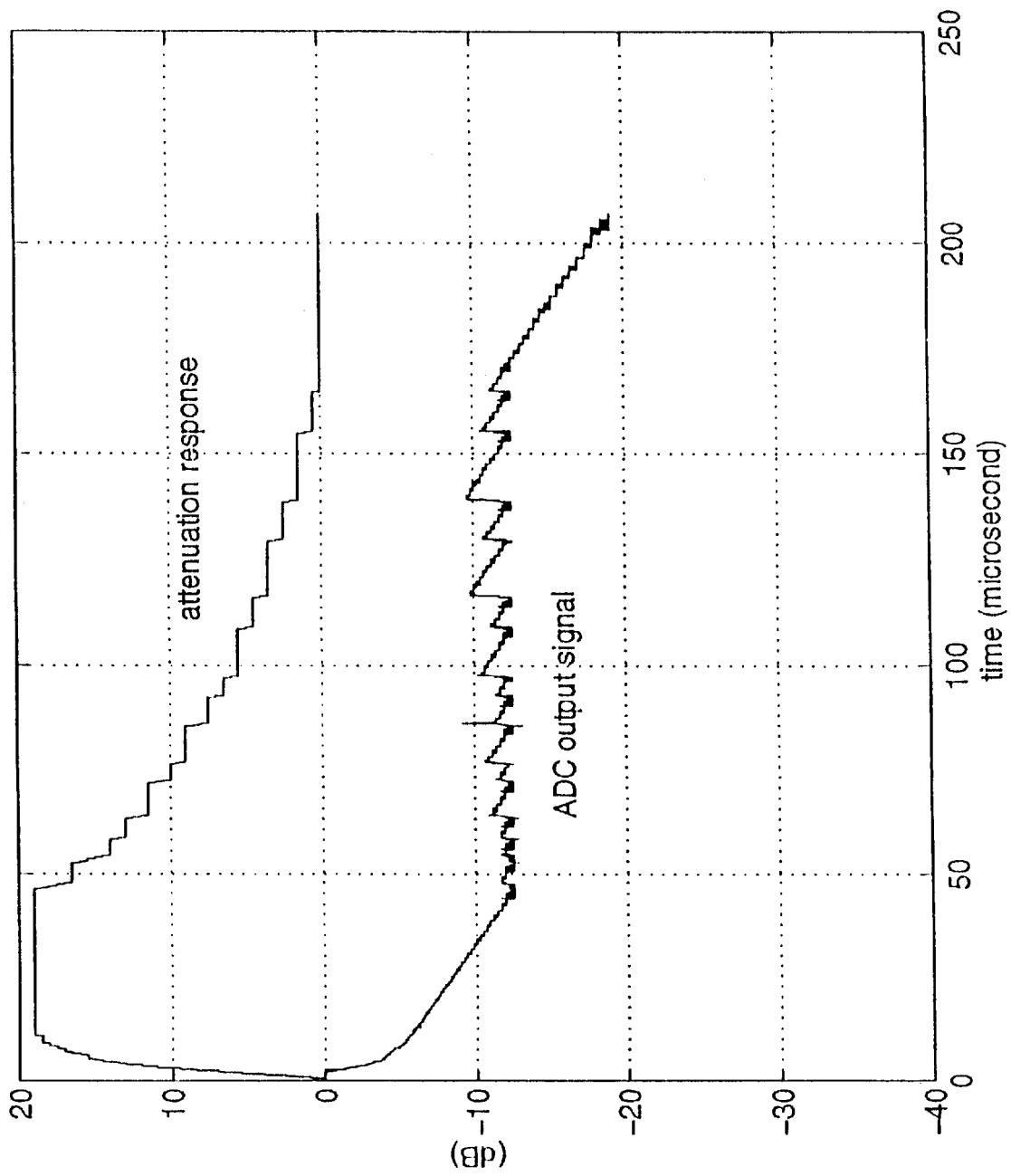
FIG. 3 shows a performance plot for the AGC circuit of FIG. 2.
Figure 4:
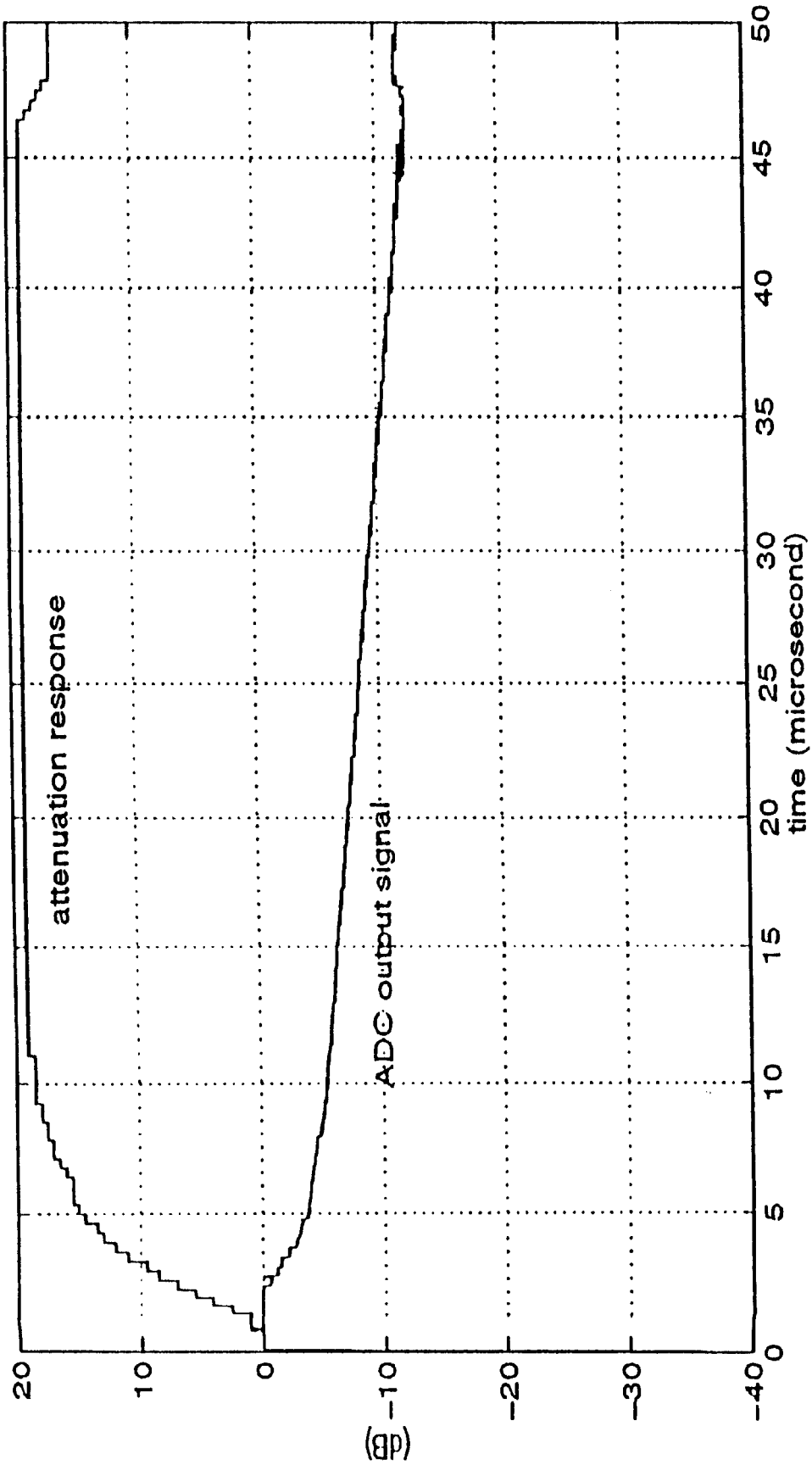
FIG. 4 shows a first magnified performance plot for the AGC circuit of FIG. 2.
Figure 5:
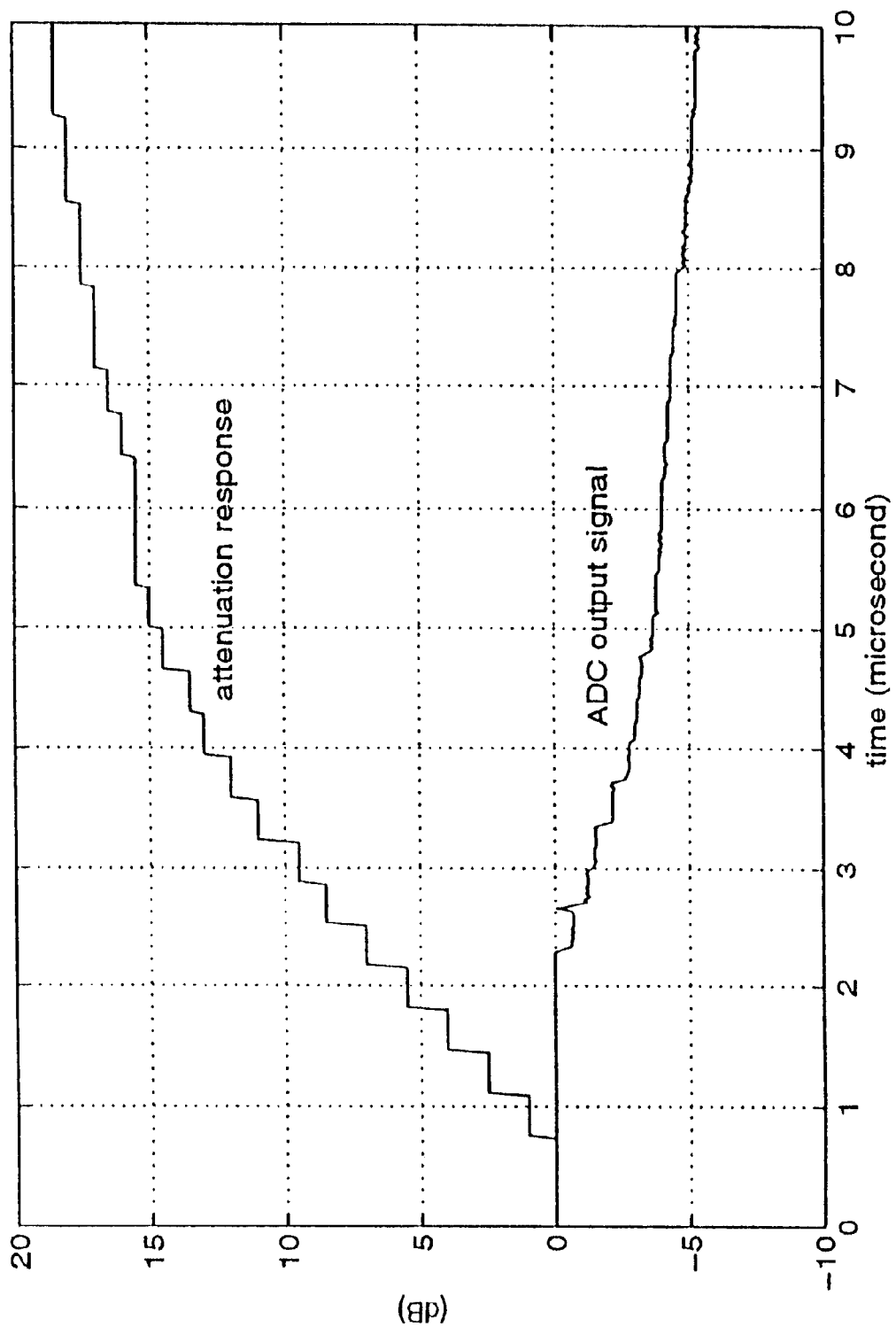
FIG. 5 shows a second magnified performance plot for the AGC circuit of FIG. 2.

To further describe the operation of the AGC in the acquisition and recovery modes, FIG. 3 illustrates a timing diagram of the AGC attenuation response to an AC coupled 20 dB ADC input overload decay and the corresponding ADC output signal power for a period of 250 uS. It must be noted however that for simplicity purposes, the ADC output signal is referenced to 0 dB which, for this embodiment, corresponds to the 4 dBm ADC clipping level. As a result, it can be observed that because of the decaying nature of the ADC input signal, the maximum AGC attenuation setting in this example is 19 dB. It can further be observed that as the ADC input signal power reaches −12 dB, the AGC controller unit 6 enters the recovery mode of operation described above to gradually remove the attenuation in 0.5 dB steps. The operation of the AGC controller unit 6 in the acquisition mode is further illustrated in FIGS. 4 and 5 where magnified time diagram representations of the AGC attenuation response and corresponding ADC output signal power are shown for a zoomed time scale respectively extending from 0 uS to 50 uS and from 0 uS to 10 uS. In particular, it can be observed on both FIGS. 4, 5 that the ADC clipping time is approximately 2.5 uS which corresponds to an AGC attack time which is also approximately 2.5 uS.

Numerous modifications and variations of the present invention are possible in light of the above teachings. It is therefore to be understood that within the scope of the appended claims, the invention may be practised otherwise than as specifically described herein.

We claim:

1. A method of providing an AGC (automatic gain control) in a wideband receiver for a received composite RF (radio frequency) signal containing RF signals each having an RF bandwidth associated with a particular air interface standard, the method comprising prior to demodulation of the received composite RF signal the steps of:

digitizing the received composite RF signal in the wideband receiver for producing digital samples;

comparing an absolute value of each digital sample to a first predetermined reference level for producing an error signal;

accumulating the error signal for a predetermined number of the digital samples defining a sample window;

for each contiguous sample window;

calculating an attenuation adjustment in proportion to the accumulated error signal by considering only digital samples with an absolute value above the first predetermined reference level;

if the accumulated error signal is greater than zero, summing the attenuation adjustment with a previously calculated receiver gain setting to provide an updated receiver gain setting; and applying the updated receiver gain setting in the wideband receiver.

2. A method as claimed in claim 1, wherein the step of comparing consists of subtracting the first predetermined reference level from the absolute value of each digital sample for producing the error signal.

3. A method as claimed in claim 1, wherein the step of calculating the attenuation adjustment comprises the steps of:

for each predetermined number of digital samples received, enabling a first count of the number of digital samples above the first predetermined reference level; and shifting the accumulated error signal by an amount corresponding to the first count for producing the attenuation adjustment.

4. A method as claimed in claim 3, wherein the predetermined number of digital samples is selected to be as small as possible for achieving a fast AGC attack time.

5. A method of providing an AGC (automatic gain control) in a receiver comprising the steps of:

digitizing a received signal in the receiver for producing digital samples;

comparing the digital samples to a first predetermined reference level for producing an error signal;

accumulating the error signal for a predetermined number of the digital samples;

for each predetermined number of digital samples received, enabling a first count of the number digital samples above the first predetermined reference level;

shifting the accumulated error signal by an amount corresponding to the first count for producing an attenuation adjustment;

if the accumulated error signal is greater than zero. summing the attenuation adjustment with a previously calculated receiver gain setting to provide an updated receiver gain setting;

comparing the digital samples to a second predetermined reference level for producing a second count of digital samples having an amplitude less than the second predetermined reference level;

decreasing the previously calculated receiver gain setting by a fixed amount if the count of digital samples is equal to the predetermined number of digital samples for alternatively providing the updated receiver gain setting; and applying the updated receiver gain setting in the receiver.

6. A method as claimed in claim 5, wherein the second predetermined reference level is lower than the first predetermined reference level.

7. A method as claimed in claim 5, wherein the fixed amount by which the previously calculated receiver gain setting is decreased is set to 0.5 dB for minimizing fluctuations of the receiver gain setting.

8. A method as claimed in claim 5, wherein the updated receiver gain setting may subsequently be reversed for regenerating the digital samples based on the received signal power.

9. An AGC (automatic gain control) circuit for a wideband receiver for a received composite RF (radio frequency) signal containing RF signals each having an RF bandwidth associated with a particular air interface standard, the AGC circuit comprising:

an ADC (analog-to-digital converter) for generating digital samples of the received composite RF signal;

a controller which prior to demodulation of the received composite RF signal compares an absolute value of each digital sample to a first predetermined reference level, accumulates an error signal for a predetermined number of the digital samples defining a sample window and, for each contiguous sample window, calculates an attenuation adjustment based on the accumulated error signal by considering only digital samples with an absolute value above the first predetermined reference level for providing an updated receiver gain setting; and an actuator for applying the updated receiver gain setting.

10. The AGC circuit as claimed in claim 9 wherein the controller comprises:

a first decision unit for comparing the digital samples to the first predetermined reference level for producing the error signal;

an accumulator for accumulating the error signal;

a first counter for counting the number of digital samples above the first predetermined reference level;

a shifting unit which calculates the attenuation adjustment in proportion to the accumulated error signal and the number of digital samples above the first predetermined reference level for providing the attenuation adjustment; and an adder for summing the attenuation adjustment with a previously applied receiver gain setting for providing the updated receiver gain setting.

11. The AGC circuit as claimed in claim 10 wherein the first decision unit is a subtracter.

12. An AGC (automatic gain control) circuit for a receiver comprising:

an ADC (analog-to-digital converter) for generating digital samples of a received signal;

a first decision unit for comparing the digital samples to a first predetermined reference level to produce an error signal;

an accumulator for accumulating the error signal;

a first counter for counting the number of digital samples above the first predetermined reference level;

a shifting unit which calculates the attenuation adjustment in proportion to the accumulated error signal and the number of digital samples above the first predetermined reference level for providing the attenuation adjustment;

an adder for summing the attenuation adjustment with a previously applied receiver gain setting for providing the updated receiver gain setting for providing the updated receiver gain setting;

a second decision unit which compares the digital samples to a second predetermined reference level;

a second counter for counting the number of digital samples below the second predetermined reference level; and a subtracter for decreasing the previously applied receiver gain setting by a fixed amount to alternatively provide the updated receiver gain setting.

13. The AGC as claimed in claim 12 wherein the second decision unit is a comparator.

14. The AGC as claimed in claim 9 wherein the actuator is located close to the ADC for minimizing AGC over-reaction and large variations of the receiver gain setting and for providing a fast attack time.

15. The AGC as claimed in claim 9 in combination with compensation means for regenerating the digital samples based on the received signal power.

* * * * *